United States Patent
Yu

(10) Patent No.: US 9,279,923 B2
(45) Date of Patent: Mar. 8, 2016

(54) COLOR FILTER LAYER AND METHOD OF FABRICATING THE SAME

(71) Applicant: UNITED MICROELECTRONICS CORPORATION, Hsinchu (TW)

(72) Inventor: Cheng-Hung Yu, Taoyuan County (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 256 days.

(21) Appl. No.: 13/850,297

(22) Filed: Mar. 26, 2013

(65) Prior Publication Data

US 2014/0293469 A1    Oct. 2, 2014

(51) Int. Cl.
G02B 5/22     (2006.01)
G02B 5/20     (2006.01)
G03F 7/00     (2006.01)

(52) U.S. Cl.
CPC .............. *G02B 5/201* (2013.01); *G03F 7/0007* (2013.01)

(58) Field of Classification Search
CPC .......... G02B 5/201; G02B 5/20; G02B 5/223; G02B 5/285; G02B 1/115; G02F 1/13351
USPC .......................................... 359/891, 890, 885
See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,721,999 A | 1/1988 | Takemura |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,712,064 A * | 1/1998 | Miyazaki et al. .................. 430/7 |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,069,350 A | 5/2000 | Ohtsuka |
| 6,071,826 A | 6/2000 | Cho |
| 6,081,018 A | 6/2000 | Nakashiba |
| 6,087,211 A | 7/2000 | Kalnitsky |
| 6,124,200 A | 9/2000 | Wang |
| 6,294,313 B1 | 9/2001 | Kobayashi |
| 6,297,160 B1 | 10/2001 | Chien |

(Continued)

*Primary Examiner* — Jade R Chwasz
(74) *Attorney, Agent, or Firm* — Ding Yu Tan

(57) ABSTRACT

A method for fabricating a color filter layer, which is applied to an integrated circuit manufacturing process, includes the following steps. Firstly, a substrate is provided, and a groove structure is formed on the substrate. The groove structure includes a plurality of positive photoresist patterns and a plurality of trenches. Then, a first group of color filter patterns is formed in the trenches. The plurality of positive photoresist patterns is removed, so that a portion of a top surface of the substrate is exposed. Then, a second group of color filter patterns is formed on the exposed top surface of the substrate.

9 Claims, 3 Drawing Sheets

(56) References Cited

U.S. PATENT DOCUMENTS

| | | |
|---|---|---|
| 6,338,976 B1 | 1/2002 | Huang |
| 6,352,876 B1 | 3/2002 | Bordogna |
| 6,369,417 B1 | 4/2002 | Lee |
| 6,376,797 B1 | 4/2002 | Piwczyk |
| 6,388,278 B1 | 5/2002 | Suzuki |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,566,151 B2 | 5/2003 | Yeh |
| 6,617,189 B1 | 9/2003 | Lin |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,960,512 B2 | 11/2005 | Cheng |
| 7,006,294 B2 | 2/2006 | Steenblik |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,498,190 B2 | 3/2009 | Kao |
| 7,648,851 B2 | 1/2010 | Fu |
| 2001/0023086 A1 | 9/2001 | Park |
| 2004/0122328 A1 | 6/2004 | Wang |
| 2005/0019679 A1* | 1/2005 | Lo et al. ............................ 430/7 |
| 2005/0024520 A1 | 2/2005 | Yamamoto |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0157144 A1 | 7/2008 | Lee |
| 2008/0169546 A1 | 7/2008 | Kwon |
| 2008/0265348 A1 | 10/2008 | Maas |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1* | 1/2010 | Liu ............................ 430/326 |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0159632 A1 | 6/2010 | Rhodes |
| 2010/0315734 A1 | 12/2010 | Wu |
| 2011/0057277 A1 | 3/2011 | Yu |

\* cited by examiner

COLOR FILTER LAYER AND METHOD OF FABRICATING THE SAME

FIELD OF THE INVENTION

The present invention relates to a color filter layer and a method for fabricating the same, and particularly to a color filter layer, which can be applied to an integrated circuit, and a method for fabricating the same, which can be applied to an integrated circuit manufacturing process.

BACKGROUND OF THE INVENTION

Recently, a miniaturization trend of portable electronic products, such as cameras, has led to a dimension of an image sensor disposed therein to become smaller and smaller. On the other hand, a pixel density of the image sensor is substantially increased. In the image sensor, a color filter for filtering the color of light of an image is mainly made of a color photoresist material by a photo-lithography process. However, a resolution of a current color photoresist material cannot be suitable for the decreased dimensions of the image sensor, so that the current color photoresist material cannot satisfy the demand of the higher pixel density. Especially, a residue problem and a contamination problem are easy to occur to affect the quality of the color filter and to cause an image light interference, which would seriously affect the image quality of the image sensor.

Therefore, what are needed are a color filter layer and a method for fabricating the same to overcome the above drawbacks.

SUMMARY OF THE INVENTION

The present invention provides a method for fabricating a color filter layer, which can be applied to an integrated circuit manufacturing process. The method includes the following steps. Firstly, a substrate is provided, and a groove structure is formed on the substrate. The groove structure includes a plurality of positive photoresist patterns and a plurality of trenches. Then, a first group of color filter patterns is formed in the plurality of trenches. The plurality of positive photoresist patterns is removed, so that a partial surface of the substrate is exposed. Then, a second group of color filter patterns is formed on the exposed surface of the substrate.

The present invention also provides a color filter layer, which can be applied to an integrated circuit. The color filter layer includes a substrate and a plurality of color negative photoresist patterns. The plurality of color negative photoresist patterns is disposed on the substrate, wherein an aspect ratio of each of the color negative photoresist patterns, i.e., a ratio between a highness thereof vertical to the substrate and a width thereof parallel to the substrate, is great than or equal to 7.

In the method of fabricating the color filter layer, a groove structure is firstly formed on the substrate, and then a first group of color filter patterns and a second group of color filter patterns are respectively formed to constitute the color filter layer. Because the groove structure is made of a positive photoresist material having high resolution, the resolution of the color filter layer is determined according to the resolution of the positive photoresist material so that is not limited to the resolution of the color negative photoresist material. Thus, the resolution of the color filter layer can be increased without using the color negative photoresist material with high resolution, thereby facilitating saving production cost. Further, the residue problem and contamination problem of the color negative photoresist material can be avoided. With the decrease of the dimensions of the semiconductor components, the increase of the pixel density can be achieved by using the color filter layer fabricated by the method of the present invention. Furthermore, in the color filter layer of the present invention, an aspect ratio of each of color negative photoresist patterns is great than or equal to 7, and a width of each of color negative photoresist patterns can be equal to or slightly greater than a width of a corresponding photosensitive element. Thus, the color filter layer fabricated by the method of the present invention has good dispersing performance, thereby improves the performance of the image sensor.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1A:
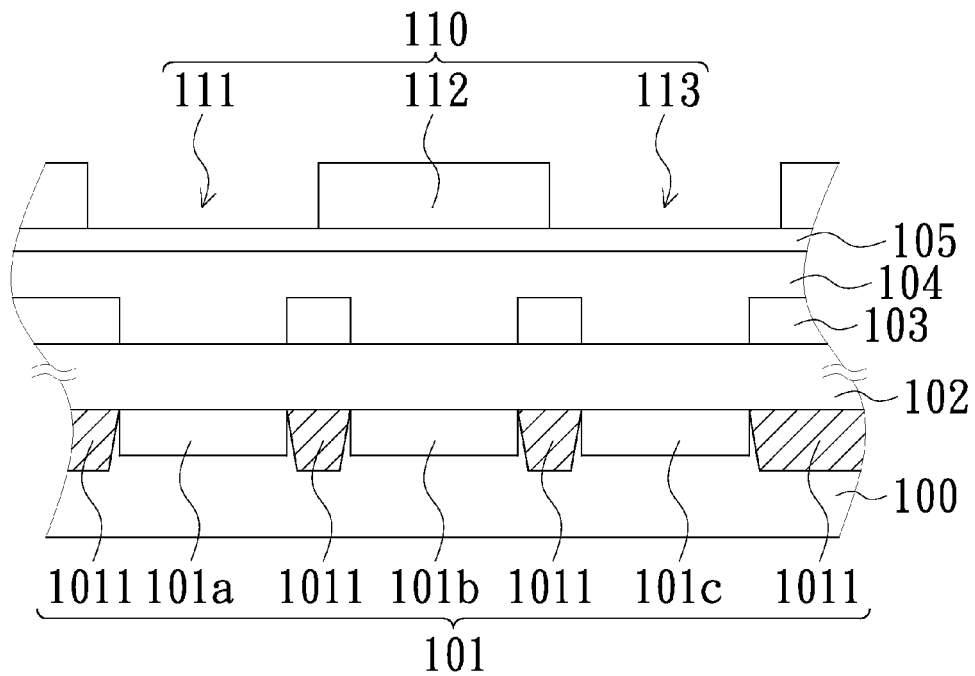
FIG. 1A illustrates a schematic view of a substrate with a groove structure formed thereon in accordance with an embodiment of the present invention.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

"Positive photoresist" described in the present invention refers to a photo-decomposition organic compound. The positive photoresist can be soluble in a specific solution after being exposed to absorb the energy of light with specific wavelength, and the positive photoresist that is not exposed to the light cannot be soluble in the specific solution. When the photo-decomposition organic compound is used in a photo-lithography process, a positive pattern identical to a mask pattern can be obtained. "Negative photoresist" described in the present invention refers to a photo-polymerization organic compound. The negative photoresist that is not exposed can be soluble in a specific solution, and the negative photoresist cannot be soluble in the specific solution after being exposed to absorb the energy of light with specific wavelength. When the photo-polymerization organic compound is used in a photo-lithography process, a negative pattern opposite to a mask pattern can be obtained. "Resolution" described in the present invention refers to a minimum line width of a mask pattern developed by the positive photoresist or the negative photoresist when being applied in the photo-lithography process. In other words, the mask pattern includes a number of lines spaced with an identical distance therebetween. When a distance of two adjacent lines of the mask pattern becomes smaller, the resolution is then higher. Currently, in terms of the photoresist applied in the integrated circuit manufacturing process, for example, in the 110-nanometer manufacturing process, the minimum resolution of the positive photoresist is greater than the minimum resolution of the negative photoresist. For example, the minimum resolution of the positive photoresist is about 0.1 micrometers, and the minimum resolution of the negative photoresist is in a range from about 1.0 to 1.4 micrometers.

In order to accommodate the decrease of the dimensions of semiconductor components, an exposure light source used in the photo-lithography process of the integrated circuit has gradually been changed form a long wavelength light source with low energy to a short wavelength light source with high energy. For example, a mercury lamp with 365 nm (i-line) wavelength light has been replaced by an exciting laser with deep-ultraviolet wavelength light such as a KrF laser with 248 nm wavelength light, an ArF laser with 193 nm wavelength light, and also been replaced by an electron beam or a X-ray exposure light source with shorter wavelength light than the exciting laser. Thus, smaller dimensions of the semiconductor component can be obtained. During the photo-lithography process of the integrated circuit, with respect to the exposure light source with various wavelengths light, it is necessary to use a photoresist material capable of absorbing a specific wavelength light. However, due to the minimum resolution of the negative resist material, it is difficult for the negative photoresist material to cooperate with the exposure light source with short wavelengths light to achieve a demanded resolution of the semiconductor component. For example, a negative photoresist material used to form a color filter layer of an image sensor can not achieve a sufficiently high resolution. The present invention provides a method for fabricating a color filter layer. In the method of present invention, an exposure source is not limited, and a color negative photoresist material is also not limited. The color filter layer fabricated by the method can reach a deep sub-micron resolution, even a nanometer resolution to satisfy a nanometer-scale device design. The method is described as follows.

FIG. 1A illustrates a schematic view of a substrate with a groove structure formed thereon in accordance with an embodiment of the present invention. At first, a substrate 100 is provided. Next, a groove structure 110 is formed on the substrate 100. The groove structure 110 includes a plurality of positive photoresist patterns, such as the positive photoresist patterns 112, and a plurality of trenches, such as the trenches 111, 113. Before forming the groove structure 110, an image sensing element layer 101 is previously formed in the substrate 100. The image sensing element layer 101 includes a plurality of isolation structures 1011 and a plurality of photosensitive elements. The plurality of photosensitive elements includes, for example, a photosensitive element 101a, a photosensitive element 101b, and a photosensitive element 101c, as shown in FIG. 1A. Each of the photosensitive elements 101a, 101b, 101c is isolated with the plurality of the isolation structures 1011, wherein a device type of the plurality of photosensitive elements can be, for example, a photo diode, but is not limited in the present invention. At least an interlayer dielectric layer 102, a metal layer 103 and a passivation layer 104 are sequentially formed above the image sensing element layer 101; in addition, a first planar layer 105 can be selectively formed on the passivation layer 104. The interlayer dielectric layer 102 can be, but not limited to, made of a silicon oxide or nitride. The metal layer 103 can be, but not limited to, made of a metal material such as copper and titanium, or an alloy material. The passivation layer 104 can be, but not limited to, made of a colorless transparent insulating material such as silicon oxide. The first planar layer 105 can be, but not limited to, made of a negative photoresist material. Because of the presence of the first planar layer 105, the substrate 100 can have a top surface with higher flatness so as to benefit a subsequent fabrication of a color filter layer, thereby increasing an adhesion of the color filter layer and the surface of the substrate 100.

In the present embodiment, the groove structure 110 is formed by the following steps. A positive photoresist layer is applied onto the substrate 100 by a coating method. The positive photoresist layer can be, but not limited to, made of a positive photoresist material containing a photo-decomposition compound such as Diazonaphthoquinone (DNQ). Thereafter, the positive photoresist layer is defined by a photo-lithography process, thereby forming a plurality of positive photoresist patterns, such as the positive photoresist patterns 112, and a plurality of trenches, such as the trenches 111, 113, on the substrate 100. The plurality of positive photoresist patterns and the plurality of the trenches constitute the groove structure 110, wherein each of the positive photoresist patterns and each of the trenches respectively correspond to one of the photosensitive elements. For example, as shown in FIG. 1A, the trench 111, 113 respectively correspond to and are aligned with the photosensitive element 101a, 101c, and the positive photoresist pattern 112 corresponds to and is aligned with the photosensitive element 101b.

Figure 1B:
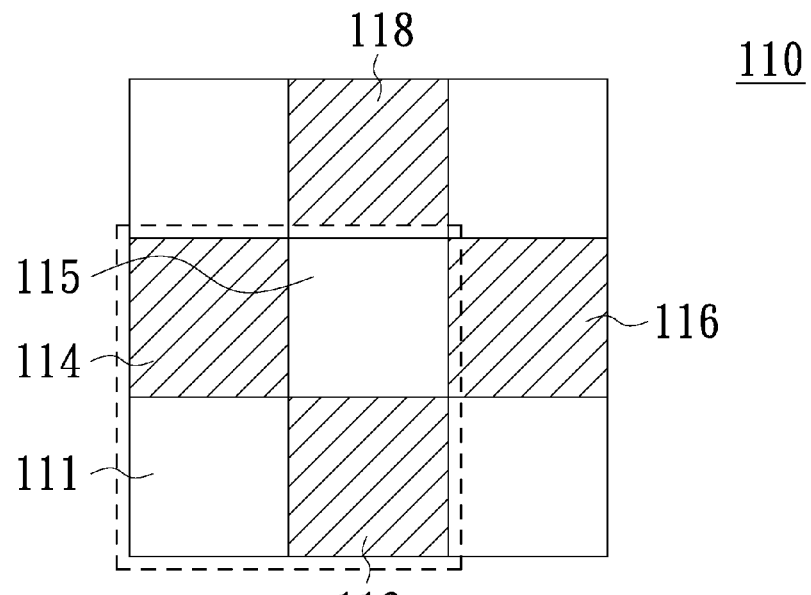
FIG. 1B illustrates a schematic, top view of the groove structure in accordance with an embodiment of the present invention.

FIG. 1B illustrates a schematic, top view of the groove structure 110 in accordance with an embodiment of the present invention. Referring to FIG. 1B, the groove structure 110 has a square chess-board pattern. In detail, each of the trenches is adjacent to four positive photoresist patterns; for example, the trench 115 is adjacent to the positive photoresist patterns 112, 114, 116 and 118. Likewise, each of the positive photoresist patterns is adjacent to and surrounded by four trenches. It is noted that, in other embodiments, the pattern of the groove structure is not limited by the square chess-board pattern, the configurations of the positive photoresist patterns and the trenches, can be for example, rectangle, diamond, regular polygon or circular, and can be designed according to the actual demand. In order to describe the steps for fabricating the color filter, only two trenches 111, 115 and two positive photoresist patterns 112, 114 are shown in FIG. 1C and FIG. 1D, which are located in a pixel region of sub-pixels array (i.e., a region confined in a dashed-line box as shown in FIG. 1B), for the sake of brevity.

Figure 1C:
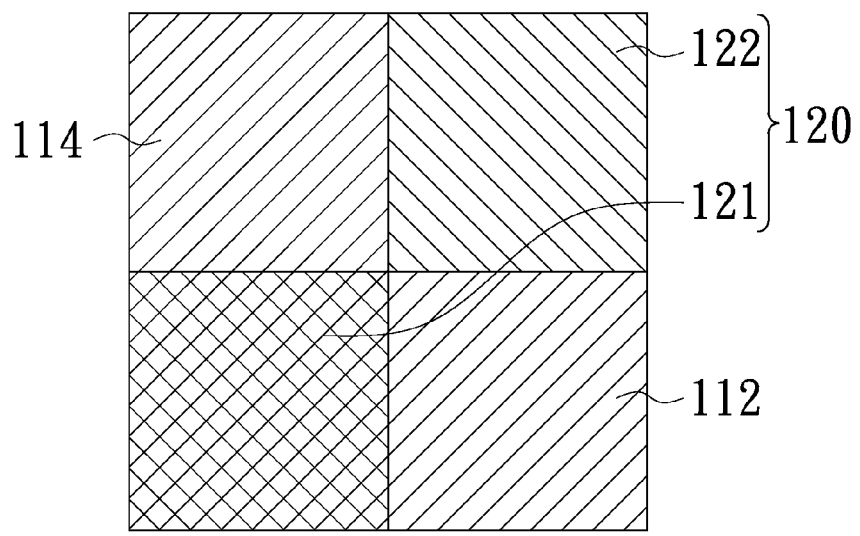
FIG. 1C illustrates a schematic, top view of the pixel array region shown in FIG. 1B, where a first group of color filter patterns is formed.

FIG. 1C illustrates a schematic, top view of the pixel region shown in FIG. 1B, where a first group of color filter patterns is formed. Referring to FIG. 1C, a first group of color filter patterns 120 is formed in the trenches. The first group of color filter patterns 120 includes a plurality of color negative photoresist patterns. The plurality of color negative photoresist patterns can be in an identical color or different colors. In the present embodiment, the first group of color filter patterns 120 includes at least a first color negative photoresist pattern 121 and at least a third color negative photoresist pattern 122. The first color negative photoresist pattern 121 and the third color negative photoresist pattern 122 have different colors. For example, the first color negative photoresist pattern 121 is, but not limited to, blue and the third color negative photoresist pattern 122 is, but not limited to, red. In other embodiments, the first color negative photoresist pattern 121 and the third color negative photoresist pattern 122 can be in an identical color. That is, the first group of color filter patterns 120 has a single color. For example, the first color negative photoresist pattern 121 and the third color negative photoresist pattern 122 are, but not limited to, green.

Further, the first group of color filter patterns 120 can be formed by the following steps. A first color negative photoresist layer is formed on the groove structure 110 as shown in FIG. 1B. In the present embodiment, the first color negative photoresist layer is, for example, blue. A material of the first color negative photoresist layer can be a general-grade commercial color filter material. A resolution of the material of the first color negative photoresist layer is, but not limited to, in a range from several micrometers to 1.0 micrometers. Thereafter, a portion of the first color negative photoresist layer is removed with a photo-lithography process, and the first color negative photoresist pattern 121 as shown in FIG. 1C is thereby formed in some of the trenches (thus formed in at least one trench taken from a portion of the plurality of trenches) such as the trench 111 as shown in FIG. 1B. That is, the remaining trenches or remaining portion of the trenches (that are not belonging to those trenches such as the trench 111) do not have the first color negative photoresist pattern 121 formed therein. After that, a third color negative photoresist layer is formed on the groove structure 110 having the first color negative photoresist pattern 121. After a photolithography process, the third color negative photoresist pattern 122 as shown in FIG. 1C is formed in the remaining trenches such as the trench 115 as shown in FIG. 1B. In the present embodiment, the third color negative photoresist pattern 122 is different from the first color negative photoresist pattern 121 and the color of the third color negative photoresist pattern 122 is, for example, red. It is noted that, in the groove structure 110 as shown in FIG. 1B, the dimensions of the positive photoresist patterns or the trenches are determined by a resolution of the material of the positive photoresist layer. The resolution of the material of the positive photoresist layer is greater than a resolution of the material of the color negative photoresist layer (e.g., the first or third color negative photoresist layer). During the photo-lithography process of the color negative photoresist layer, a solution for removing the unexposed material of the color negative photoresist layer has a higher selectivity to the material of the positive photoresist patterns. Therefore, the photo-lithography process of the color negative photoresist layer cannot damage the groove structure 110. That is, the configurations and the dimensions of the positive photoresist patterns or the trenches in the groove structure 110 can be remained or preserved after performing the photo-lithography process of the color negative photoresist layer. Thus, with the decrease of the dimensions of the photosensitive elements, the dimensions of each of the first group of color filter patterns 120 can be reduced correspondingly, which will not be limited by the resolution of the material of the color negative photoresist layer. As a result, an increase of a pixel density can be achieved.

Figure 1D:
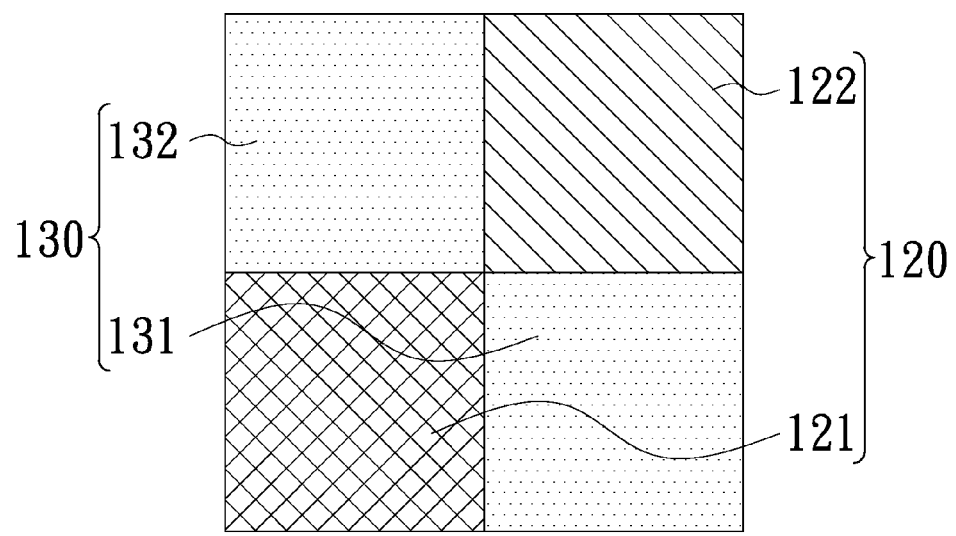
FIG. 1D illustrates a schematic, top view of the pixel array region shown in FIG. 1B, where a second group of color filter patterns is formed.

FIG. 1D illustrates a schematic, top view of the pixel array region shown in FIG. 1C, where a second group of color filter patterns is formed. Referring to FIG. 1D, after the first group of color filter patterns 120 is formed, the positive photoresist patterns, for example, the positive photoresist patterns 112, 114 as shown in FIG. 1C, are removed so as to expose a portion of a top surface of the substrate 100, wherein solvents or processes that are those which do not damage the color negative photoresist patterns in the first group of color filter patterns 120 can be applied to the step of stripping the positive photoresist patterns in the present invention. In this embodiment, a mixed solution of N-methyl-2-pyrrolidone (NMP) and acetone used as the solvent of stripping the positive photoresist patterns has a high selectivity to the material of the color negative photoresist patterns. Therefore, the removing process of the positive photoresist patterns can not damage the first group of color filter patterns 120. That is, the configurations and the dimensions of the first group of color filter patterns 120 can be remained after the removing process of the positive photoresist patterns. Thus, the dimensions of each of the color negative photoresist patterns can be reduced, which will not be limited to the resolution of the material of the color negative photoresist layer. Further, the residue problem and contamination problem of the material of the color negative photoresist layer in the photo-lithography process will be avoided; thereby a dispersing performance of the color filter layer is improved.

Next, a second group of color filter patterns 130 is formed on the exposed top surface of the substrate 100. In other words, the second group of color filter patterns 130 is located in the space created by removing the positive photoresist patterns. The second group of color filter patterns 130 includes a plurality of color negative photoresist patterns. In the present embodiment, the color of the first color negative photoresist pattern 121 is blue, and of the third color negative photoresist pattern 122 is red. Thus, the second group of color filter patterns 130 can be in an identical color or have different colors. For example, the color of the second group of color filter patterns 130 can be green or a combination of green and other colors. In another embodiment, if the first group of color filter patterns 120 has identical color, such as green, the second group of color filter patterns 130 can be formed to have different colors by performing the photo-lithography process as described above. For example, referring to FIG. 1D, at first, at least a second color negative photoresist pattern 131 is formed, which the color thereof is but not limited to blue. And then, a fourth color negative photoresist pattern 132 is formed, which the color thereof is but not limited to red. The first group of color filter patterns 120 and the second group of color filter patterns 130 constitute a color filter layer of an image sensor.

Figure 2:
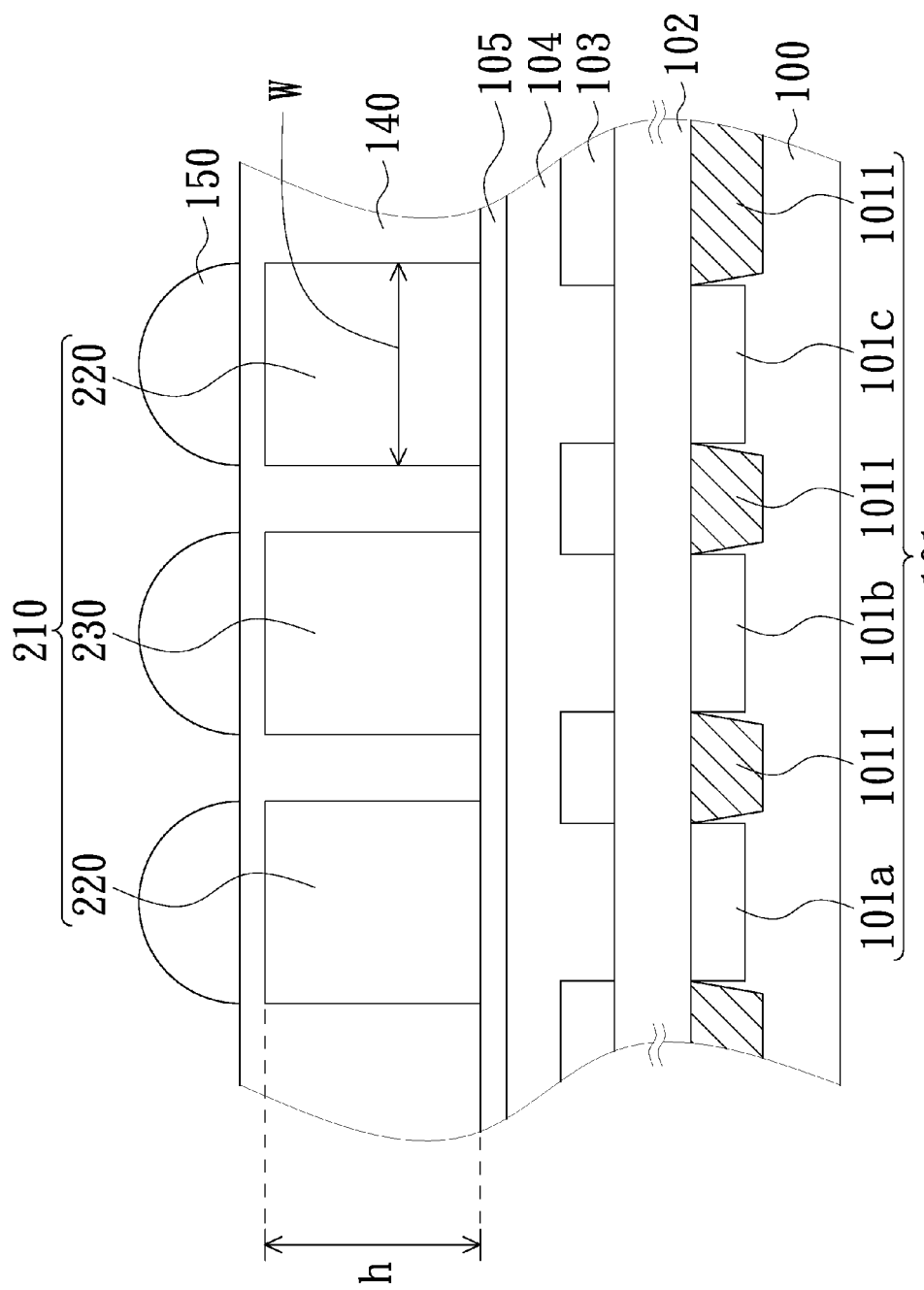
FIG. 2 illustrates a schematic, partial, cross-sectional view of an image sensor using the color filter layer in accordance with an embodiment of the present invention.

FIG. 2 illustrates a schematic, partial, cross-sectional view of an image sensor using the color filter layer in accordance with an embodiment of the present invention. Referring to FIG. 2, the advantages of the color filter layer of the present invention are further described. Similar to the substrate 100 shown in FIG. 1A, the image sensing element layer 101, the interlayer dielectric layer 102, the metal layer 103, the passivation layer 104 and the first planar layer 105 are sequentially formed above the substrate 100. The image sensing element layer 101 includes the plurality of isolation structures 1011 and the plurality of photosensitive elements such as the photosensitive elements 101$a$, 101$b$ and 101$c$ shown in FIG. 2. In the present embodiment, each of the photosensitive elements 101$a$, 101$b$, 101$c$ corresponds to a pixel region where the pixels are arranged in a line. Further, a color filter layer 210, a second planar layer 140 and a micro lens layer 150 are sequentially formed on the first planar layer 104. The color filter layer 210 is formed with the method as mentioned above. Firstly, a groove structure is formed. Next, a first group of color filter patterns 220 and a second group of color filter patterns 230 are respectively formed to constitute the color filter layer 210. It is noted that, in the present embodiment, the color filter patterns in a pixel region are arranged in a line. The first group of color filter patterns 220 includes, but not limited to, blue and red negative photoresist patterns, and the second group of color filter patterns 230 includes, but not limited to, green negative photoresist patterns. The second planar layer 140 and the micro lens layer 150 can respectively be colorless transparent negative photoresist materials with an identical refractive index from 1.5 to 1.6.

Additionally, the resolution of the color negative photoresist material is affected not only by the chemical properties thereof but also by the thickness thereof. When the resolution of the color negative photoresist material for manufacturing the color filter layer of the image sensor is limited to the chemical properties thereof, the thickness of the color negative photoresist layer is reduced so as to increase the resolution of the color negative photoresist layer to adapt to the decrease of the dimensions of the photosensitive elements. However, the thickness of the color negative photoresist layer is reduced, which will affect the dispersing performance of the color filter layer. For the color filter layer formed by the method in accordance to the present invention, the resolution of the color negative photoresist layer is determined according to the resolution of the positive photoresist material for forming the groove structure. Thus, it is not necessary to reduce the thickness of the color negative photoresist layer to increase the resolution of the color negative photoresist layer. According to the resolution of the positive photoresist layer and a thickness about 1.0 to 0.7 micrometers of the color filter layer, an aspect ratio of each of the color negative photoresist patterns in the color filter layer of the present invention is great than or equal to 7. That is, as shown in FIG. 2, in a pixel region of the color filter layer 210, each of the color negative photoresist patterns has an aspect ratio, i.e., a ratio between a height thereof vertical to the substrate and a width thereof parallel to the substrate, great than or equal to 7. Further, the aspect ratio thereof can be up to 10 or more according to actual demand of designing the image sensor.

In summary, Because the groove structure is made of a positive photoresist material having higher resolution, the resolution of the color filter layer is determined according to the resolution of the positive photoresist material, so that is not limited to the resolution of the color negative photoresist material. Thus, the resolution of the color filter layer can be increased without using the color negative photoresist material of higher resolution, thereby facilitating savings on manufacturing cost. Further, the residue problem and contamination problem of the color negative photoresist material can be avoided. With the decrease of the dimensions of the semiconductor components, the increase of the pixel density can be achieved by using the color filter layer fabricated by the method of the present invention. Furthermore, in the color filter layer of the present invention, an aspect ratio of each of color negative photoresist patterns is great than or equal to 7, and a width of each of color negative photoresist patterns can be equal to or slightly greater than a width of a corresponding photosensitive element. Thus, the color filter layer fabricated by the method of the present invention has good dispersing performance, thereby improves the performance of the image sensor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a color filter layer, comprising:
   providing a substrate;
   forming a plurality of 3D patterns of positive photoresist composition;
   after forming the plurality of 3D patterns of positive photoresist composition, forming a first group of color filter patterns on the substrate and between at least two 3D patterns of positive photoresist composition, wherein the first group of color filter patterns comprises at least a first color 3D pattern of negative photoresist composition;
   after forming the first group of color filter patterns, removing the plurality of 3D patterns of positive photoresist composition so as to expose a portion of a top surface of the substrate; and
   forming a second group of color filter patterns on the exposed top surface of the substrate.

2. The method as claimed in claim 1, wherein the substrate has a plurality of photosensitive elements formed thereon.

3. The method as claimed in claim 1, wherein the step of forming the first group of color filter pattern further comprises:
   forming the first color 3D pattern of negative photoresist composition; and
   forming at least a third color 3D pattern of negative photoresist composition, wherein the third color 3D pattern of negative photoresist composition and the first color 3D pattern of negative photoresist composition have different colors.

4. The method as claimed in claim 1, wherein the second group of color filter patterns comprises at least a second color 3D pattern of negative photoresist composition.

5. The method as claimed in claim 4, wherein the step of forming a second group of color filter patterns on the exposed top surface of the substrate further comprises:
   forming the second color 3D pattern of negative photoresist composition in a portion of the exposed top surface of the substrate; and
   forming at least a fourth color 3D pattern of negative photoresist composition on a remaining portion of the exposed top surface of the substrate, wherein the fourth color 3D pattern of negative photoresist composition and the second color 3D pattern of negative photoresist composition have different colors.

6. The method as claimed in claim 1, wherein the second group of color filter patterns and the first group of color filter patterns have different colors.

7. The method as claimed in claim 1, wherein the first group of color filter patterns and the second group of color filter patterns in a pixel region are arranged in a line.

8. The method as claimed in claim 1, the first group of color filter patterns and the second group of color filter patterns in a pixel region are arranged in an array.

9. The method as claimed in claim 1, wherein each of the first group of color filter pattern s is in contact with neighboring ones without a black matrix interposed therebetween.

\* \* \* \* \*